United States Patent [19]
Berard

[11] Patent Number: 4,852,026
[45] Date of Patent: Jul. 25, 1989

[54] METHOD AND APPARATUS FOR THE EVALUATION OF AN ANGLE OVER AN EXTENDED RANGE

[75] Inventor: Michel Berard, Palaiseau, France

[73] Assignee: Enertec, Montrouge, France

[21] Appl. No.: 879,196

[22] Filed: Jun. 25, 1986

[51] Int. Cl.$^4$ .............................................. G01B 11/16
[52] U.S. Cl. ..................................... 364/556; 324/96; 356/72; 250/231 SE
[58] Field of Search ................... 356/72, 368; 200/225, 200/231 SE; 364/556; 324/83 Y, 83 D, 96; 350/374, 375

[56] References Cited

U.S. PATENT DOCUMENTS

| | | | |
|---|---|---|---|
| 3,605,013 | 9/1971 | Yoshikawa | 324/96 |
| 3,675,125 | 7/1972 | Jaecklin | 324/94 |
| 3,678,399 | 7/1972 | Mottier | 328/134 |
| 3,769,384 | 10/1973 | Iten et al. | 324/96 |
| 4,117,399 | 9/1978 | Ono et al. | 324/96 |
| 4,232,264 | 11/1980 | Papp et al. | 328/134 |
| 4,426,620 | 1/1984 | Buchenauer | 324/83 Y |
| 4,442,350 | 4/1984 | Rushleigh | 324/96 |

FOREIGN PATENT DOCUMENTS

| | | |
|---|---|---|
| 108671 | 5/1984 | European Pat. Off. . |
| 3006840 | 8/1981 | Fed. Rep. of Germany . |
| 2083381 | 12/1971 | France . |
| 2237250 | 2/1975 | France . |

OTHER PUBLICATIONS

Smith, A. M., "Polarization and Magnetooptic Properties of Single-Mode Optical Fiber", *Applied Optics*, vol. 17, No. 1 (Jan. 1, 1978).

Papp, A. and Harms, H., "Magnetooptical Current Transformer", *Applied Optics*, vol. 19, No. 22, Nov. 15, 1980, pp. 3729–3734.

Rogers, A. J., "Optical Methods for Measurement of Voltage and Current on Power Systems", *Optics and Laser Technology*, Dec. 1971, pp. 273–283.

"Universal Trigonometric Function Generator", by Analog Devices, pp. 1–12 (describing Model AD639) (1978).

Primary Examiner—Parshotam S. Lall
Assistant Examiner—Ellis B. Ramirez
Attorney, Agent, or Firm—Sughrue, Mion, Zinn, Macpeak & Seas

[57] ABSTRACT

A method and device for evaluating an angle A known by at least two trigonometric functions and capable of varying over a range greater than 360°.

Two counter integers $N_0$, $N_1$ are stored and up-dated, each with respect to the other, as a function of even and odd indicator signals $FC_2$, $FS_2$.

The value of the angle A, expressed in quarter turns, is given by the first or the second counter number as a function of the value of the even indicator signal $FC_2$.

8 Claims, 4 Drawing Sheets

METHOD AND APPARATUS FOR THE EVALUATION OF AN ANGLE OVER AN EXTENDED RANGE

FIELD OF THE INVENTION

The present invention concerns a method and an apparatus for evaluating the variation, from an initial instant, of an angle A capable of varying over a range greater than 90°, by using instantaneous values of at least an even indicator signal $FC_2$ and an odd indicator signal $FS_2$, respectively related to the signs of the cosine and the sine of the double angle 2A.

BACKGROUND OF THE PRIOR ART

It frequently happens, in the optical field, that signals which are trigonometrical functions of a magnitude to be measured are produced or have to be processed.

In particular, as shown in the article by A. J. Rogers: "Optical methods for measurement of voltage and current on power systems/Optics and Laser Technology/December 1977/pages 273 to 283", or the article by A. M. Smith: "Polarization and magnetooptic properties of single-mode optical fiber/Applied optics, vol. 17, No. 1/Jan. 1 1978/pages 52 to 56", or again the article by A. Papp and H. Harms: "Magnetooptical current transformer/Applied optics/15 November 1980/Vol. 19, No. 22/pages 3729 to 3734", measurements of current by Faraday effect lead to the production of trigonometric signals which are proportional to the sine and cosine of twice the angle of rotation of the plane of polarization of a light beam.

As is known, two out-of-phase trigonometric functions, such as sine and cosine, can define an angle only within a single turn. It is therefore necessary, when an angle is capable of changing through more than 360°, to provide means for counting the number of turns effected by this angle in one direction or the other.

An example of a known apparatus permitting the measurement of an angle in a range greater than 360° is given by German Pat. No. DE 30 06 840.

However, this apparatus is adapted only for the measurement of the phase difference between a reference signal and a measurement signal, and does not correspond to the introduction developed hereinabove.

DISCLOSURE OF THE INVENTION

The object of the invention, consists on the contrary, consists of providing a method and an apparatus permitting the measurement, over an extended and virtually infinite range, of an angle which is known only by intermediary data comprising its trigonometric functions.

In particular, the apparatus according to a preferred embodiment of this invention enables the obtaining of a certain and correct measurement even when the angle being measured is changing rapidly and/or can change sign in a random manner.

The method of the invention, which uses the instantaneous values of an even indicator signal $FC_2$ and an odd indicator signal $FS_2$, respectively related to the signs of the sine and cosine of the double angle 2A, includes the steps of:

(a) at an initial instant, putting into and storing in memory, two counter numbers, $N_0$, $N_1$;

(b) defining a localization parameter X by assigning to it, as a function of the instantaneous value of the even indicator signal, the value of one or other of the counter numbers $N_0$, $N_1$;

(c) reading out the other of the counter numbers $N_0$, $N_1$, by assigning it as a new value that of the localization parameter increased or decreased by one in dependence upon the instantaneous value of the product of the two indicator signals;

(d) repeating or maintaining the operations (b) and (c) in the course of time; and (e) producing at least a first output signal related to the localization parameter X, the variation of which represents, expressed in numbers of quarter turns, the variation of the angle A since the initial instant.

DESCRIPTION OF THE PREFERRED EMBODIMENTS

Preferably, the even and odd indicator signals $FC_2$ and $FS_2$ are respective direct representations of the signs of the cosine and the sine of the double angle 2A and the counter number reset during step (c) hereinabove takes the value of the localization parameter increased by one if the product of the indicator signals is positive and decreased by one if this product is negative.

In a more complete implementation, although not necessary in all applications, the method of the invention can, by using a cosine tracking signal C proportional to the cosine of the angle A and a sine tracking signal S proportional to the sine of this angle, comprise supplementary operations consisting of choosing a measurement signal M respectively proportional to the cosine and sine tracking signals when the even indicator signal is respectively negative and positive, and improving the evaluation of the angle A by assigning to this angle the value represented by the algebraic sum of the first output signal and a second output signal equal to the arc sine of the measurement signal M. The coefficient of proportionally relating M to C or M to S is such that M is expressed directly by cos A or sin A.

The angle A can then be evaluated from the expression:

$$X \cdot 90° + (FC_2) \cdot (FS_2) \text{ Arc sin } |M|,$$

where X is the localization parameter, $(FC_2)$ and $(FS_2)$ are respectively the even and odd indicator signals taking the values +1 or −1 following the positive or negative sign of the cosine and the sine of the double angle 2A respectively, and where $|M|$ designates the absolute value of the measurement signal.

By way of a variation within the scope of the present invention, the measurement signal can be produced so as to be equal to $|\cos A|$ or $|\sin A|$ according to whether the even indicator signal is negative or positive, the angle A then being evaluated from the expression:

$$X = 90° + (FC_2) \cdot (FS_2) \text{ Arc sin } M.$$

If the function Arc sin is defined over a range covering at least the interval from −45° to +45°, the angle A can also be evaluated from the expression:

$$X = 90° + FD \cdot \text{Arc sin } M.$$

where X is the localization parameter, FD is an out-of-phase indicator signal, taking the values +1 or −1 according to the sign of the difference C−S of the cosine and sine tracking signals, and where M is the measurement signal.

The apparatus of the invention, essentially intended to implement the method, is characterised in that it comprises:
  two read/write memories;
  memory reading address means responsive to the even indicator signal and adapted to deliver at a first output of the apparatus a duplication signal X representative of the contents of one of the two memories, selected according to the value of the even indicator signal ($FC_2$);
  an operator circuit adapted, according to the value of the product of the indicator signals, to increment or decrement the value of the duplication signal X; and memory writing address means adapted to write in the one of the two memories which is not selected the value of the duplication signal X as modified by the operator circuit.

This apparatus can additionally comprise an inverse trigonometric function conversion circuit receiving a measurement signal M related, as a function of the value of the even indicator signal, either to the cosine of the angle A or the sine of the angle A, and supplying at a second output of the apparatus a signal representative of an inverse trigonometricl function of the measurement signal.

A particular exemplary implementation of the invention will be described hereinafter with reference to the appended drawings.

BRIEF DESCRIPTION OF THE DRAWING

FIG. 1 is an assembly for measuring a current by the Faraday effect.

Figure 1:
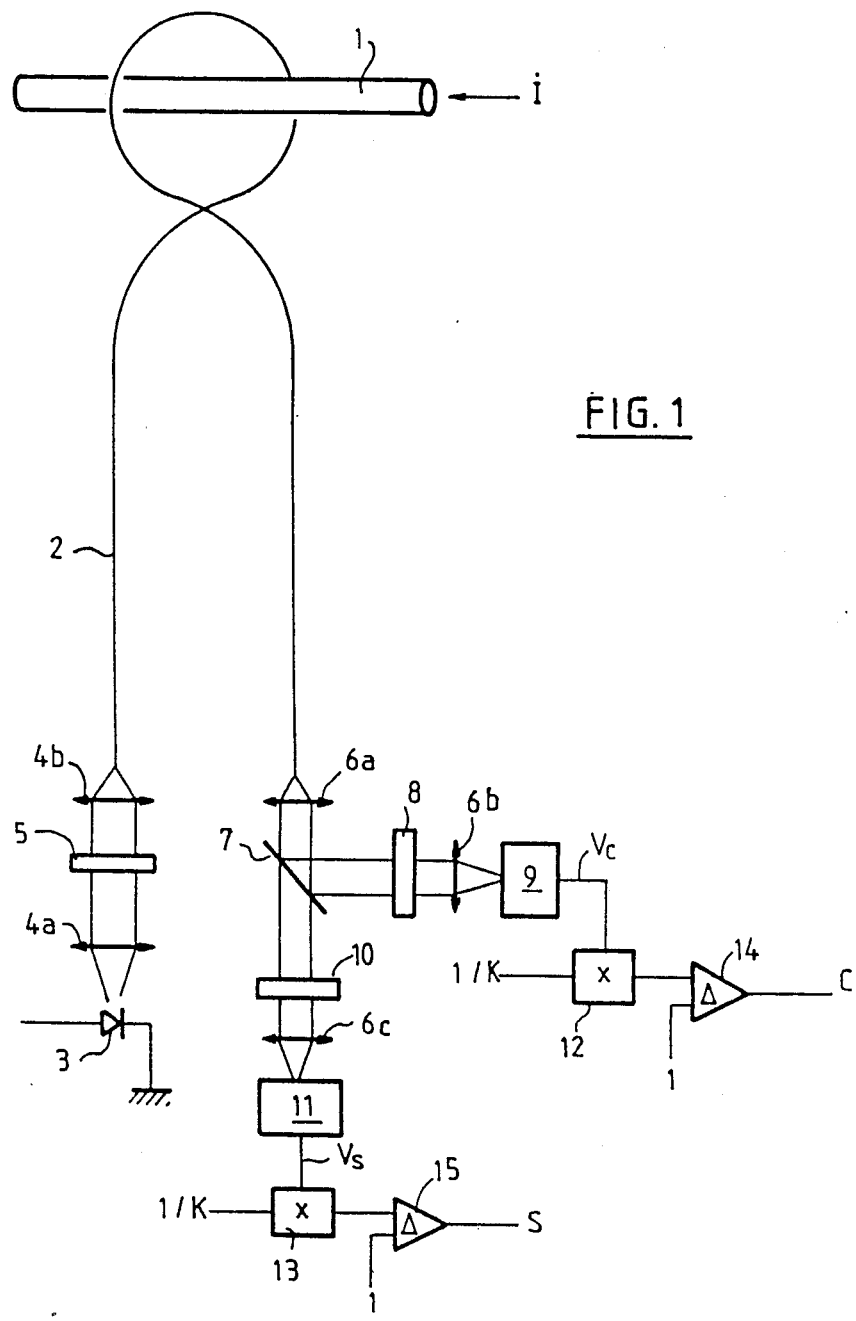
FIG. 1 represents a device, not forming part of the invention, given by way of example of an opto-electronic assembly producing signals represented by trigonometric functions of an angle capable of undergoing a rotation of several turns.

A current i flows in a conductor 1 around which is wound, in one or several turns, a monomode optical fiber 2.

At one end of the fiber, through an appropiate optical system, comprising for example two lenses 4a and 4b disposed on each side of a polariser 5, a laser diode 3 injects a linearly polarized beam of light.

The emergent beam, passing through a lens 6a, is divided into two secondary beams, for example, by a semi-transparent mirror 7.

One of the secondary beams, passing through an analyzer 8 and a lens 6b, is detected by a photodetector 9 which prouduces an electrical signal $V_c$ proportional to the intensity of the light beam received.

In a similar manner, the other secondary beam, passing through an analyzer 10 and a lens 6c, is detected by a photodetector 11 which produces an electrical signal $V_s$ proportional to the intensity of the light beam received.

In the absence of the current i, the direction of polarization of the emergent beam, which will be taken as a reference, depends only on the direction of the axis of polarization of the polarizer 5 and on the possible optical activity of the fiber 2.

However, in the presence of the current i, the direction of polarization of the emergent beam makes with the reference direction an angle $a_F$ (the Faraday angle) of which the value, proportional to the current i and the number of turns of the fiber around the conductor 1, can change through a range as large as necessary, for example greater than 360°.

The direction of the axis of the analyzer 8 coincides with the reference direction, such that the signal $V_c$ produced by the photodetector 9 is proportional to $\cos^2(a_F)$, that is to say, also equal to $K_c \cdot [1+\cos(2 \cdot a_F)]$, where $K_c$ is a term related to the intensity of the secondary beam diverted toward the analyzer 8 and to the gain of the photodetector 9.

The direction of the axis of the analyzer 10 makes on the contrary an angle of 45° with the reference direction, so that the signal $V_s$ produced by the photodetector 11 is proportional to $\cos^2(45° - a_F)$, that is to say also equal to $K_s \cdot [1+\sin(2a_F)]$ where $K_s$ is a term related to the intensity of the secondary beam transmitted through the analyzer 10 and to the gain of the photodetector 11.

If the optical paths and the gains of the photodetectors 9 and 11 are balanced, one thus obtains two signals:

$$V_c = K \cdot (1 + \cos A)$$

$$V_s = K \cdot (1 + \sin A)$$

where $K = K_s = K_c$ and where $A = 2a_F$.

By multiplying these signals by $1/K$ in respective multipliers 12 and 13 and by eliminating the constant term "1" in respective amplifiers 14 and 15, one can obtain two signals C and S such that $C = \cos A$ and $S = \sin A$.

Figure 2:
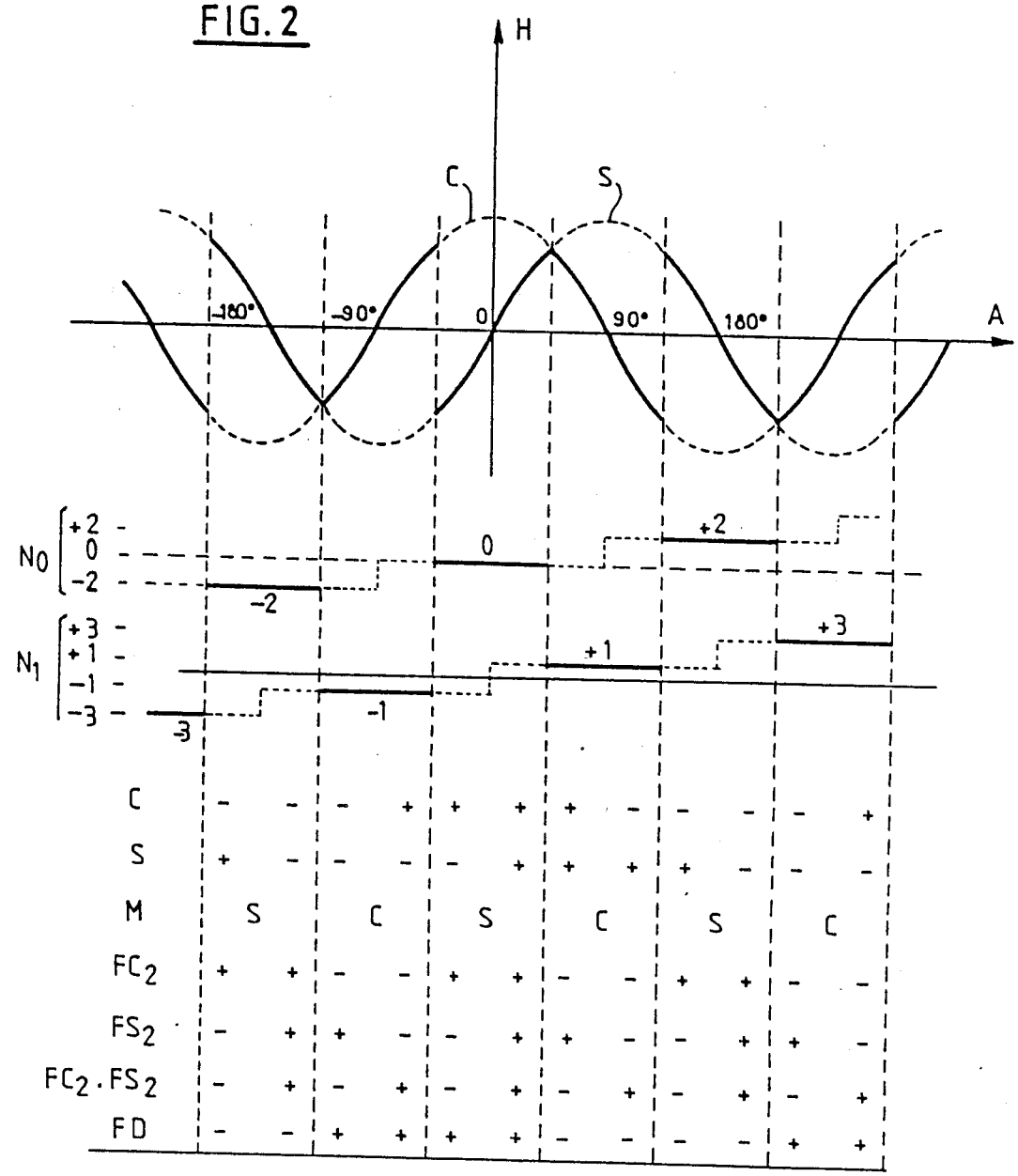
FIG. 2 shows, as a function of the variation of the angle A to be measured, the values of the different signals used in the invention or useful for its comprehension.

The amplitude H of the signals C and S, representing directly the orthogonal trigonometrical functions of the angle A to be measured, is shown in FIG. 2, as a function of the angle A.

From the signals C and S (FIG. 2) or from signals constituted by combinations of these, it is possible, in a known manner, to produce signals related to the cosine or to the sine of angles which are multiples or sub-multiples of the angle A to be measured, or to their polarity.

Thus, from the signals C and S, it is possible to form a signal $FC_2$ to the sign of the cosine of the double angle 2A; as the cosine of the double angle 2A is an even function of this angle 2A, the signal $FC_2$ will be called the even indicator signal.

For example:

$$FC_2 = |C| - |S|, \text{ or}$$

$$FC_2 = C^2 - S^2, \text{ or}$$

$$FC_2 = C^4 - S^4, \text{ etc.}$$

Under the circumstances, the positive or negative polarity of a signal $FC_2$ thus formed reveals a positive or negative sign of the function $\cos(2A)$.

In the same way, from the signals C and S or from their polarity FC and FS it is possible to form a signal $FS_2$ related to the sign of the sine of the double angle 2A; since sin (2A) is an odd function of 2A, $FS_2$ will be called the odd indicator signal.

For example:

$$FS_2 = FC \cdot FS \text{ or }$$

$$FS_2 = C \cdot S, \text{ or}$$

$$FS_2 = C^3 \cdot S^3, \text{ etc.}$$

To the extent that the product $FC_2 \cdot FS_2$ represents the sign of the sine of the quadruple angle 4A, it is equivalent to say that the method of the invention uses the even and odd indicator signals $FC_2$, $FS_2$, or the even indicator signal $FC_2$ and the product of the indicator signals $FC_2 \cdot FS_2$, or yet again the even indicator signal $FC_2$ and an odd indicator signal of order 4, $FS_4$, related to the sign of the sine of the quadruple angle 4A.

The method comprises putting in memory two counter numbers $N_0$, $N_1$ (see FIGS. 2 and 3) which, for convenience, will be chosen to be integers.

At an initial instant, for which the absolute value of the angle A is for example less than 45°, the number $N_0$ is set to zero. The value of the number $N_1$ at this initial instant is not important, as will be seen immediately.

The method comprises, after this initialization phase, the following two operations which must be executed continuously with time, or at least in an iterative fashion, as the angle A must be evaluated: in the case of an iterative process, the frequency of the iterations must be such that the variation of the angle A between two iterations is less than 45°.

The first operation or step in the method consists of defining a localization parameter X. This parameter is equal to $N_0$ if $FC_2$ is positive and to $N_1$ if $FC_2$ is negative. If FIG. 2, the localization parameter X is shown as a full line on the variations of $N_0$ and of $N_1$; at the initial instant, for which it has been supposed that $|A|$ is less than 45°, $N_0$ and $X = N_0 = 0$.

The second operation or step in the method consists of setting the other of the two counter numbers, that is to say $N_0$ if $FC_2$ is negative and $N_1$ if $FC_2$ is positive. This other counter number then adopts the value of the localization parameter X increased or reduced by one unit according to whether the product $FC_2 \cdot FS_2$ of the indicator signals is positive or negative. Thus, just after the initial instant, for which $N_0 = 0$, the value of the counter $N_1$ (a priori any number) is set to $+1$ if A is positive and less than 45° and at $-1$ if A is negative or zero and greater than $-45°$.

Under these conditions, the localization parameter X (or its variation since the initial instant, if it is not reset to zero at this instant) indicates, in multiples of quarter turns, the variation of the angle A since the initial instant.

Figure 3:
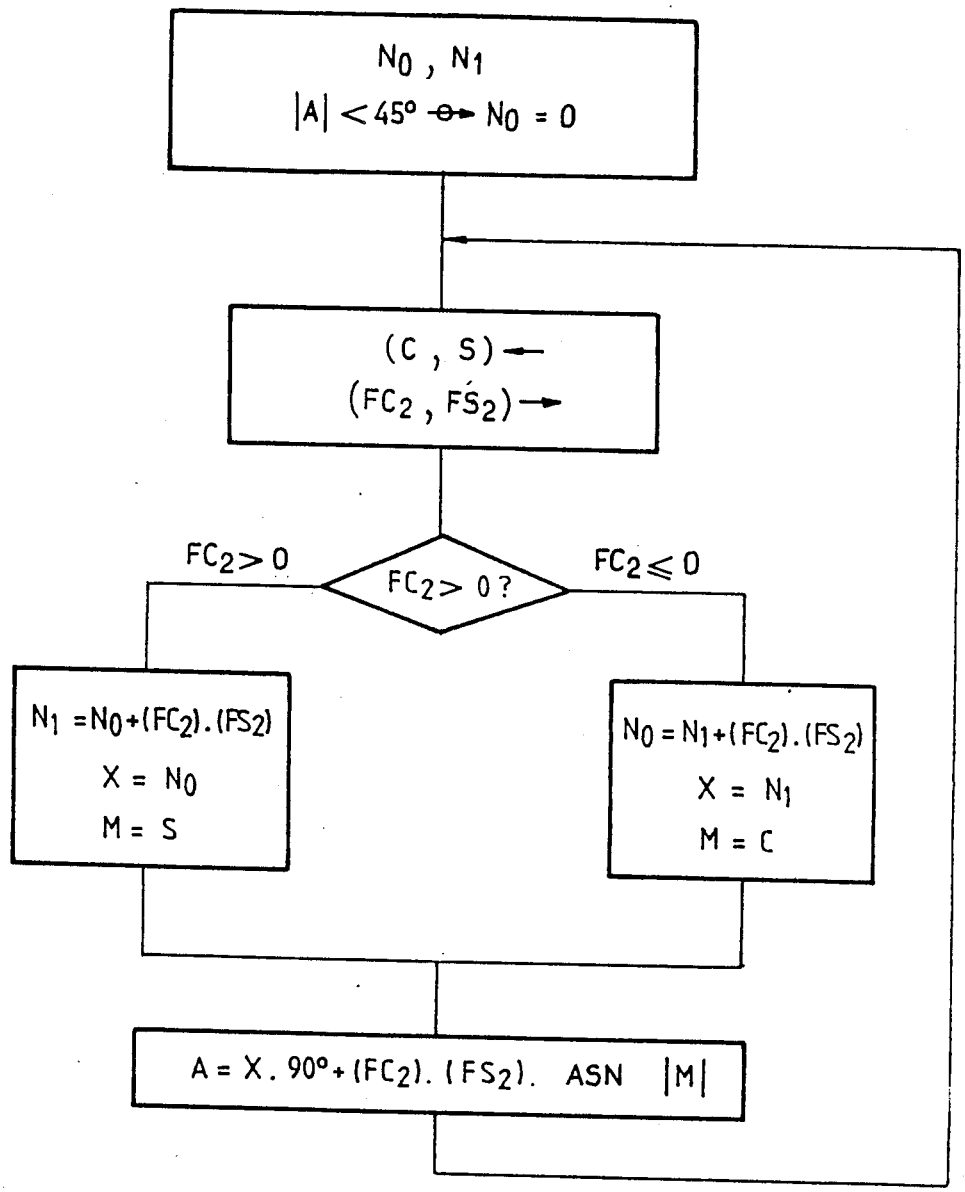
FIG. 3 is a flow chart of the method, as it is implemented in an iterative fashion in time by a microprocessor or in an essentially continuous fashion or, at the very least, asynchronously by an electronic circuit.

The operations described can be best understood with reference to FIG. 3 which gives the operation flow chart of a microprocessor implementing the method of the invention. In this Figure, the quantities in brackets ($FC_2$) and ($FS_2$) designate the normalized values of the signals $FC_2$ and $FS_2$. Thus, ($FC_2$) has the value $+1$ if $FC_2$ is positive and $-1$ if $FC_2$ is negative (or zero); similarly ($FS_2$) has the value $+1$ if $FS_2$ is positive and $-1$ if $FS_2$ is negative (or zero).

It is possible, in certain applications, that the evaluation of the variation of the angle A in quarter turns is insufficiently accurate.

It is then necessary to use fully the information carried by the trigonometric signals such as $C = \cos(A)$ and $S = \sin(A)$ in addition to the sign information such as $FC_2$ and $FS_2$ used up till now.

The necessary supplementary operations are also illustrated in FIG. 3.

They consist essentially of starting from cosine and sine tracking signals such as $K \cdot \cos A$ and $K \cdot \sin A$, and of choosing as a function of the value of the even indicator signal $FC_2$ a measurement signal M proportional, by a factor $1/K$, either to the signal $K \cdot \cos A$ or to the signal $K \cdot \sin A$ (that is to say, equal to cos A or to sin A.

In the example chosen, the cosine tracking signal is $C = \cos A$, and the sine tracking signal is $S = \sin A$, such that the factor K is equal to 1 and the signal M is directly equal to C or S.

More precisely, as FIGS. 2 and 3 illustrate, the measurement signal M is taken equal to S when the even indicator signal $FC_2$ is positive, and equal to C in the contrary case.

Under these conditions, the angle A evolving from an initial instant for which its absolute value was less than 45°, can at any instant be evaluated from the expression:

$$A = X \cdot 90° + (FC_2) \cdot (FS_2) \cdot \text{Arc sin}|M|,$$

where X is the localization parameter (in full lines on the lines of $N_0$ or $N_1$ in FIG. 2), where ($FC_2$) and ($FS_2$) take the values $+1$ or $-1$ following the positive or negative polarity of $FC_2$ and $FS_2$ and where Arc sin $|M|$ is the arc sine of the absolute value of the measurement signal M.

The measurement signal M can also be derived so as to be equal to $|C|$ for $FC_2$ negative and to $|S|$ for $FC_2$ positive; the angle A is then evaluated from the expression:

$$A = X \cdot 90° + (FC_2) \cdot (FS_2) \cdot \text{Arc sin } M.$$

In the two cases, the function Arc sin need be defined only over a positive range covering the interval 0° to 45°.

If the function Arc sin is defined over a symmetrical range covering the interval $-45°$ to $+45°$, the angle A can be evaluated from the expression:

$$A = X \cdot 90° + FD \cdot \text{Arc sin } M$$

where FD is an out-of-phase indicator signal (see FIG. 2), taking the values $+1$ or $-1$ following the sign, positive or negative, of the difference $C - S$ between the signals C and S.

Preferably, the function Arc sin is defined over a greater range than the interval $-45°$ to $+45°$. In fact, a key advantage of the invention considered in its most complete form of implementation is to arrive at a correct evaluation of the angle A at any instant T, even if the magnitudes X, ($FC_2$) and ($FS_2$) relate to an earlier instant T—t. The only conditions to be observed are that the angle A has varied less than 45° between the instants T—t and T, that the signal M is truly representative of the cosine or sine of the angle A or of their absolute value at the instant T, and that the function Arc sin has also been defined for values of M greater in absolute value than sin 45°.

One skilled in the art will be able in other ways to use other inverse trigonometric functions than the function Arc sin with the object of obtaining a correct and precise evaluation of the angle A and, in particular, the function Arc cos y which is related to the function Arc sin y by the relation:

$$\text{Arc sin } y = 90° - \text{Arc cos } y$$

The invention, as described, permits the evaluation of the angle A by means of a single inverse trigonometric function.

Figure 4:
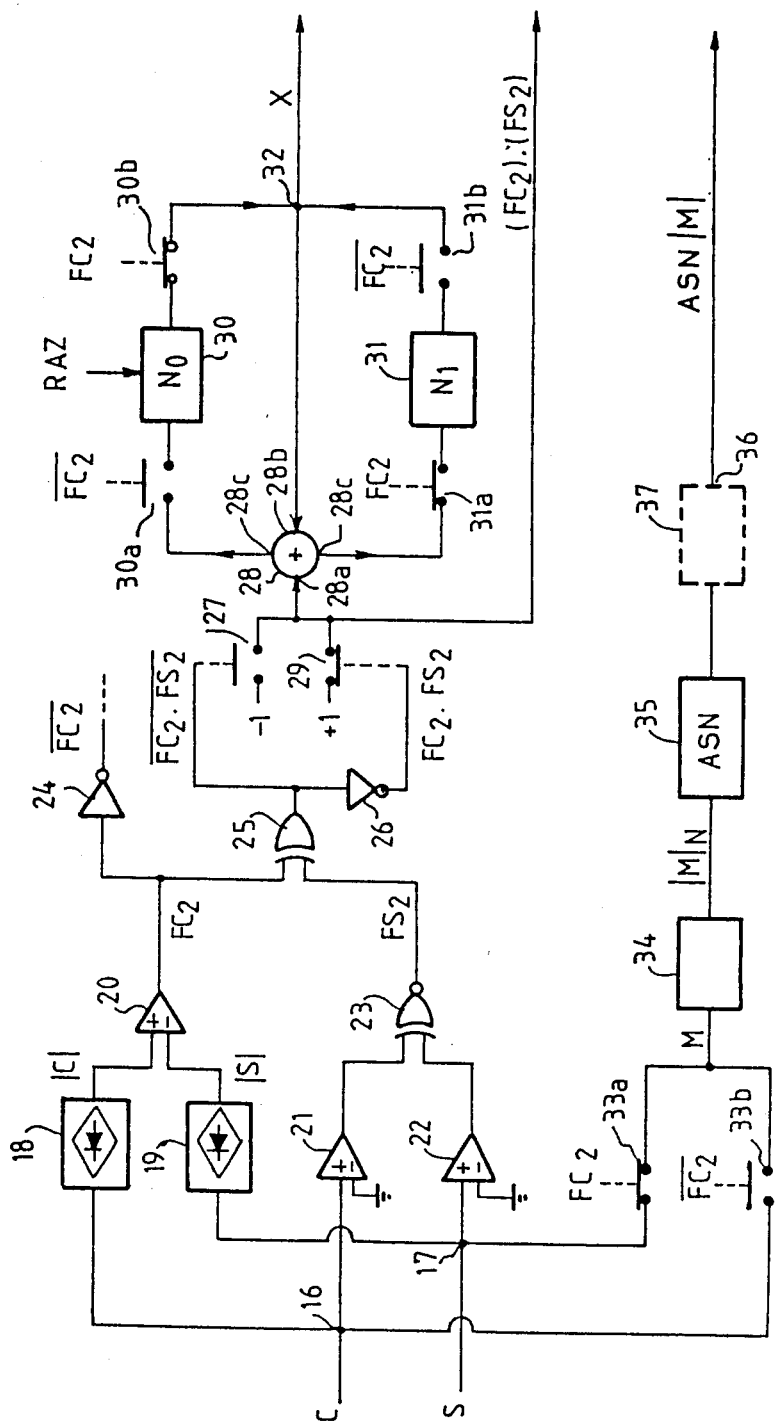
FIG. 4 illustrates, in a schematic manner, an electronic circuit implementing the method of the invention in its complete form.

FIG. 4 is a block diagram illustrating a preferred electronic circuit apparatus or device for implementing the invention.

This apparatus receives at two inputs 16 and 17 the signals C=cos A and S=sin A previously identified.

Two rectifiers 18, 19 repsectively produce rectified signals |C| and |S| of repsective amplitudes equal to those of the signals C and S but of positive sign.

A comparator 20 receiving the signals |C| and |S| produces at its output a signal $FC_2 = |C| - |S|$ of which the sign corresponds to the sign of the cosine of the double angle 2A. An inverter 24 produces the complementary signal $FC_2$—BAR, which is at a low level when the signal $FC_2$ is at a high level, and conversely.

The signals C and S arrive also at two comparators 21 and 22 producing respective output signals corresponding to the polarities of these signals C and S. The output signals of these comparators are supplied to an inverting EXCLUSIVE-OR gate 23 supplying a signal $FS_2 = FC \cdot FS$ of which the polarity corresponds to the sign of the sine of the double angle 2A.

The signals $FC_2$ and $FS_2$ are transmitted to an EXCLUSIVE-OR gate 25 which, in combination with an inverter 26, produces the signals $FC_2 \, FS_2$—BAR and $FC_2 \cdot FS_2$, of which each is at the low level when the other is at the high level.

This signal $FC_2 \cdot FS_2$—BAR controls the closure, when it is at the high level, and the opening when it is at the low level, of a switch 27 connecting a source of voltage of value $-1$ to an adder 28.

Similarly, the signal $FC_2 \cdot FS_2$ controls the closure, when it is at the high level and the opening when it is at the low level, of a switch 29 connecting a source of voltage of value $+1$ to the adder 28.

In this way, the adder 28 receives on a first input 28a a signal $(FC_2) \cdot (FS_2)$ of value $+1$ when the indicator signals $FC_2$ and $FS_2$ are of the same polarity, and of value $-1$ in the contrary case.

The device also comprises two read-write memories 30 and 31 having, in the implementation described, the form of sample-and-hold circuits capable of storing voltages representing the counter numbers $N_0$ and $N_1$.

These two memories both feed back to a second input 28b of the adder 28, which constitutes at the same time a first output 32 of the device.

Access to writing in the memories 30, 31 is controlled by respective input switches 30a, 31a, which constitute memory write addressing means; similarly, access to reading from these memories 30, 31 is controlled by respective output switches 30b, 31b, which constitute memory read addressing means.

The switches 30a and 31b, in the example described, are open when the even indicator signal is at the high level ($FC_2$—BAR is then at the low level), and closed when $FC_2$ is at the low level ($FC_2$—BAR is then at the high level). The switches 30b and 31a are closed and open in the converse conditions, such that, in FIG. 4, the switches disposed on the same diagonal adopt the same state, while the switches disposed on two different diagonals are in different states.

The input switches 30a and 31a respectively connect the inputs of the memories 30 and 31 to an output 28c of the adder 28 (two outputs 28c have been shown in the drawing for clarity: in reality, these outputs are constituted by a single output).

At an initial instant, for which the angle A is, in absolute value, less than 45°, the read/write memory 30 is reset to zero via its input RAZ. The even indicator signal $FC_2$ then being positive, the switches 30b and 31a are closed while the switches 30a and 31b are open.

The output 32 receives the signal X equal to the value $N_0$ memorized in the memory 30, i.e., zero.

The memory 31 receives the contents of the memory 30, i.e., zero, increased by the value $(FC_2) \cdot (FS_2)$, that is to say increased or decreased by one according to the sign of the product of the indicator signals $FC_2$ and $FS_2$.

If the angle A has a value for example of 40°, the memory 31 stores a signal corresponding to $N_0 + (FC_2) \cdot (FS_2) = 0 + 1 = 1$.

If, starting from this state, the angle A jumps abruptly to 80°, the polarity of the signal $FS_2$ stays the same, but that of the signal $FC_2$ is inverted, in consequence, all the switches 22, 29 301, 30b, 31a and 31b change state.

The memory 31, which contained $N_1 = 1$ just before this jump from 40° to 80°, keeps its value, and this value is supplied in the form of the signal X at the first output 32 of the device.

On the other hand, the contents $N_0$ of the memory 30, which were set to zero, are dynamically updated to $N_1 + (FC_2) \cdot (FS_2) = +1 - 1 = 0$, and a new jump of the angle A from 80° to 110°, resulting in an inversion of the polarity of $FS_2$, gives $N_0$ the value $N_2 + (FC_2) \cdot (FS_2) = +1 + 1 = 2$.

Although the signal X supplied at the output 32 is of an analog nature in the example shown, it is clear for one skilled in the art that the nature of this signal can be modified by the use of an analog-to-digital converter.

The device additionally comprises two switches 33a, 33b permitting the signal C or the signal S to be selectively applied to the input of an analog-to-digital converter 34.

These switches transmit to the converter the measurement signal M=S if the even indicator signal $FC_2$ is positive, and the signal M=C if the signal $FC_2$ is negative.

The converter 34 produces, for example, a signal constituting a digital representation $|M|_N$ of the absolute value $|M|$ of the measurement signal.

The value of this signal $|M|_N$ is used as an address value for reading a correspondence table 35 for effecting an Arc sin conversion and constituted for example by a read-only memory according to a technique known per se.

The digital signal produced by the reading of this table, possibly reconverted into an analog signal by a digital-to-analog converter 37, and representative of the magnitude Arc sin $|M|$, is transmitted to a second output 36 of the device.

This second device thus supplies the information X, $(FC_2) \cdot (FS_2)$ and Arc sin $|M|$ permitting the evaluation of the angle A, and for example its display in the form:

$$A = X \cdot 90° + (FC_2) \cdot (FS_2) \cdot \text{Arc sin } |M|.$$

Where it is desired to use a computer or a microprocessor for implementing the invention, it is sufficient to program this computer or microprocessor in a manner conforming to the flow chart of FIG. 3.

In the alternative, as with a device such as that of FIG. 4, satisfactory operation for a given speed of variation of the angle A depends upon the speed of execution of the different operations. In the device of FIG. 4, the speed is limited by the switching times and the memorization times of the sample-and-hold circuits 30, 31. In a computer or a microprocessor, the speed is limited by the duration of a cycle (acquisition of input value to result).

However, one of the principal advantages of the present invention is the proposal of a method providing a correct evaluation of the angle A (expressed in numbers of quarter turns) whatever the variation of the angle A between two successive acquisitions of input signals (second block from the top in FIG. 3), with the proviso that this variation remains less than 45° in absolute value.

The invention is particularly applicable to processing the signal produced by a Faraday effect current transformer adapted for use with a high voltage line and using a single opto-electronic assembly (such as that of FIG. 1) for the measurement of normal line currents and faulty line currents.

It is known that currents flowing in a high voltage line, in case of a fault, can be greatly in excess of the currents flowing in this line under normal conditions.

It is thus possible that a known type of Faraday effect transformer, designed for producing a measurement angle $A = 2a_F$ lying between $-45°$ and $+45°$ in normal conditions, would produce a measurement angle $A = 2a_F$ very different from these values in the case of a fault.

The application of the present invention to such a transformer permits the evaluation of this angle A at any instant, even in the case of a fault, and whatever its excursion outside the range $+45°$, $-45°$.

In such an application, the counter number $N_0$ can be reset to zero at any moment outside the fault conditions of the line.

For initializing or re-initializing the counter number $N_0$, use the fact that faults in power transmission lines are always eliminated in relatively short time intervals, for example less than a time interval $T_0$.

In consequence, if the Faraday effect current transformer is designed for producing a measurement angle between $-45°$ and $+45°$ in normal conditions, the counter number $N_0$ can be re-initialized to zero each time it remains different from zero for an interval of time greater than $T_0$.

I claim:

1. A method for evaluating the variation, from an initial instant, of an angle A capable of varying over a range greater than 90°, by using instantaneous values of at least an even indicator signal $FC_2$ and an odd indicator $FS_2$, respectively related to the signs of the cosine and the sine of a double angle 2A, comprising the steps of:
    (a) putting and storing in memory, at an initial instant, two counter numbers, $N_0$, $N_1$;
    (b) defining a localization parameter X by assigning to it, as a function of the instantaneous value of the even indicator signal, the value of one of the counter numbers $N_0$, $N_1$;
    (c) reading out the other of the counter numbers $N_0$, $N_1$, by assigning it as a new value that of the localization parameter X increased or decreased by one in dependence upon the instantaneous value of the product of the two indicator signals;
    (d) selectively repeating the previous steps (b) and (c) in the course of time; and
    (e) producing at least a first output signal related to the localization parameter X, variation of which, expressed in multiples of quarter turns, represents the variation of the angle A since the initial instant in corresponding multiples of 90°.

2. A method according to claim 1, wherein:
    the even and the odd indicator signals are respective direct representations of the signs of the cosine and the sine of the double angle 2A.

3. A method according to claim 1, wherein:
    the counter number reset during step (c) takes the value of the localization parameter X increased by one if the product of the indicator signals is positive and decreased by one if said product is negative.

4. A method according to claim 1, further comprising the steps of:
    receiving a cosine tracking signal C proportional to the cosine of the angle A and a sine tracking signal S proportional to the sine of the angle A;
    choosing a measurement signal M respectively proportional to the cosine and sine tracking signals when the even indicator signal is respectively negative and positive; and
    improving the evaluation of the angle A by assigning to this angle the value represented by the algebraic sum of the first output signal and a second output signal equal to an inverse trigonometrical function of the measurement signal M.

5. A method according to claim 4, wherein:
    the angle A is evaluated from the expression $$X \cdot 90° + (FC_2) \cdot (FS_2) \text{ Arc sin } M,$$

wherein X is the localization parameter, $(FC_2)$ and $(FS_2)$ are respectively the even and odd indicator signals taking the values $+1$ or $-1$ following the positive or negative sign of the cosine and the sine of the double angle 2A respectively, and where M designates the absolute value of the measurement signal.

6. A method according to claim 4, wherein:
    the angle A is evaluated from the expression $$X = 90° + FD \cdot \text{Arc sin } M,$$

where X is the localization parameter, FD is an out-of-phase indicator signal, taking the values $+1$ or $-1$ according to the sign of the difference $C-S$ of the cosine and sine tracking signals, and where M is the measurement signal.

7. Apparatus for evaluating the variation, from an initial instant, of an angle A that can vary over a range greater than 90°, by using at least an even indicator signal $FC_2$ and an odd indicator signal $FS_2$ respectively related to the cosine and sine of the double angle 2A, comprising:
    two read/write memories;
    memory reading address means responsive to the even indicator signal and adapted to deliver as a first output of the apparatus a duplication signal X representative of the contents of one of the two memories, selected according to the value of the even indicator signal ($FC_2$);
    an operator circuit adapted, according to the value of the product of the indicator signals, to increment or decrement the value of the duplication signal X; and memory writing address means adapted to write in that one of the two memories which was not selected the value of the duplication signal X as modified by the operator circuit.

8. A device according to claim 7, further comprising:
an inverse trigonometric function conversion circuit receiving a measurement signal M related, as a function of the value of the even indicator signal, either to the cosine of the angle A or the sine of the angle A, and supplying at a second output of the apparatus a signal representative of an inverse trigonometrical function of the measurement signal M.

* * * * *